United States Patent [19]
Brokaw

[11] Patent Number: 6,040,732
[45] Date of Patent: Mar. 21, 2000

[54] SWITCHED-TRANSCONDUCTANCE CIRCUIT WITHIN INTEGRATED T-SWITCHES

[75] Inventor: A. Paul Brokaw, Burlington, Mass.

[73] Assignee: Analog Devices, Inc., Norwood, Mass.

[21] Appl. No.: 08/833,715

[22] Filed: Apr. 9, 1997

[51] Int. Cl.[7] .................... H03K 19/094; H03K 17/16
[52] U.S. Cl. .................. 327/408; 327/427; 327/437; 327/96; 327/94; 327/563
[58] Field of Search ................. 327/408, 91, 94, 327/96, 437, 427, 554, 563, 560

[56] References Cited

U.S. PATENT DOCUMENTS

| | | | |
|---|---|---|---|
| 4,096,399 | 6/1978 | Davis et al. | 327/425 |
| 4,821,033 | 4/1989 | Mori et al. | 340/825.79 |
| 5,081,453 | 1/1992 | Endoh et al. | 340/825.79 |
| 5,126,734 | 6/1992 | Harrand | 340/825.9 |
| 5,170,335 | 12/1992 | Brokaw | 363/127 |
| 5,179,293 | 1/1993 | Hilton | 327/480 |
| 5,284,047 | 2/1994 | Brokaw | 73/35 |
| 5,289,332 | 2/1994 | Senn et al. | 327/94 |
| 5,389,833 | 2/1995 | Kay | 327/96 |
| 5,532,629 | 7/1996 | Nagaraj | 327/96 |
| 5,598,114 | 1/1997 | Jamshidi | 327/408 |

FOREIGN PATENT DOCUMENTS

| | | | |
|---|---|---|---|
| 405075395 | 3/1993 | Japan | 327/554 |

OTHER PUBLICATIONS

The Monolithic Op Amp: A Tutorial Study, James E. Solomon, IEEE J. Solid–State Circuits, vol. SC–9, pp. 12–30, Dec. 1974.
Analog Devices 250 MHz, 10ns Switching Multiplexers w/Amplifier, AD8170/AD8174, Specification, pp. 1–15.
Analog Devices, 750 MHz, 3.8mA 10ns Switching Multiplexers, AD8180/AD8182, Specification, pp. 1–12.
Analog Devices, 16 X 16 Crosspoint Switch Array, AD75019.
Burr–Brown, MPC102 Wide–Bandwidth Dual 2X 1 Video Multiplexer, pp. 1–16, Nov. 1993.
Gennum Corporation, GY4102 Fast Toggling Video Switch Data Sheet, Feb. 1991 Rev. Jul. 1991.
Linear Technology, 150 MHz Video Multiplexers, LT1203/LT1205, pp. 1–16.
Maxim Engineering Journal, New IC s Boost Video Performance, vol. 17.
Siliconix, Truth Tables and Ordering Information DG535/536, P–32167, Rev. Nov. 15, 1993.
Siliconix, 4–/8–Channel Wideband Video Multiplexers, DG534A/538A, P–32167, Rev. Nov. 15, 1993.

*Primary Examiner*—Dinh Le
*Attorney, Agent, or Firm*—Wolf, Greenfield & Sacks, P.C.

[57] ABSTRACT

A switched-transconductance circuit for use in a multiplexer circuit includes integrated T-switches to provide isolation between each of the differential voltage inputs of a transconductance stage and: (1) a respective differential current output of the transconductance stage, and (2) the opposite polarity voltage input of the transconductance stage. Each of a pair of first switches, which are enabled only when the transconductance circuit is disabled, is connected between a differential current output of the transconductance stage and a circuit ground. Each of a pair of second switches, e.g., cascode transistors, which are biased to be turned on only when the transconductance circuit is enabled, is coupled between the output of the transconductance stage and an output of the transconductance circuit. A third switch is connected between a common-emitter node of a differential pair of input transistors included in the transconductance stage and a circuit ground. By turning on the third switch: (1) current from a current source driving the differential pair of input transistors is steered away from the input transistors so as to disable the transconductance stage, and (2) a low impedance path is provided between the common-emitter node and ground.

16 Claims, 6 Drawing Sheets

SWITCHED-TRANSCONDUCTANCE CIRCUIT WITHIN INTEGRATED T-SWITCHES

BACKGROUND OF THE INVENTION

1. Field of the Invention

The present invention relates to a transconductance circuit that includes integrated T-switches for improved isolation. Such a transconductance circuit is particularly suited for use in a multiplexing circuit.

2. Discussion of Related Art

Multiplexer circuits generally are used to select one of several input signals to be provided at a single output of the multiplexer. Such multiplexer circuits may be implemented, for example, by coupling each of the several inputs to the output via transistor switches and selectively activating one of the switches. The parasitic capacitances of transistor switches, however, tend to permit high-frequency coupling between the unselected inputs and the output of the multiplexer.

One circuit employed to reduce crosstalk between the input and output of a multiplexer switch, i.e., crosstalk between channels, is shown in FIG. 1. This circuit commonly is referred to as a "T-switch." As shown, the T-switch has an input 20 to receive an input signal and an output 22 to provide an output signal. The select signal on line 26 activates or deactivates the T-switch. When select line 26 is high, i.e., a voltage is placed thereon that is above a predetermined threshold voltage (e.g., three volts), transistors M1 and M2 are turned on and transistor M3 is turned off. Hence, when select line 26 is high, the T-switch is activated and a low impedance path, i.e., a conductance path including only the "on" resistance of transistors M1 and M2 in series, is provided (via transistors M1 and M2) between input 20 and output 22, thereby permitting a signal at input 20 to be provided at output 22. Conversely, when select line 26 is low, i.e., a voltage is placed thereon that is below a predetermined threshold voltage (e.g., three volts), transistors M1 and M2 are turned off and transistor M3 is turned on. Thus, when select line 26 is low, the T-switch is deactivated and the impedance of the path from input 20 to output 22 is much higher in this state, i.e., the impedance is equal to the "off" impedance of transistors M1 and M2 in series.

When the T-switch is deactivated, although the parasitic capacitances of transistors M1 and M2 are present (permitting high frequency input signals, e.g., greater than one Megahertz (1 MHZ), to reach node 28 of the T-switch), transistor M3 provides a low impedance path from node 28 to ground node GND, i.e., a constant voltage node. Therefore, when the T-switch is deactivated, much of the unselected input signal that normally would pass through to the output (resulting in crosstalk between the unselected input and the output) is shunted from node 28 to ground. The transfer function of such a T-switch is that of a two-pole high-pass filter, as compared to the single-pole (high-pass) transfer function of a simpler single-transistor switch. Thus, a multiplexer employing T-switches, rather than single-transistor switches, should exhibit improved low-frequency isolation between its unselected-inputs and its output because of this enhanced filtering effect.

Such a T-switch implementation of a multiplexer results in negligible static power dissipation, i.e., the power that is dissipated when a particular multiplexer channel is selected (limited by transistor leakage), zero offset between the input and output, and a large input signal range, i.e., bounded approximately one transistor threshold voltage above and below, respectively, the low-voltage and high-voltage supply rails of the circuit. Since the T-switch is bidirectional (due to its symmetry), however, the input source is coupled directly to the output load when the T-switch is activated. Because the inputs are coupled directly to the outputs, the number of outputs to which an input may be fanned out is limited, especially if the output loads are resistive. In addition, the bidirectional nature of T-switches typically necessitates a break-before-make switching sequence so as to avoid the momentary shorting of input sources together when switching channels.

When metal oxide semiconductor (MOS) transistors are used in T-switches, the pass transistors, e.g., transistors M1 and M2 in FIG. 1, can introduce significant distortion in the transfer function between an input and an output. This distortion results because the "on" resistance of an MOS transistor varies with the gate-to-source voltage ($V_{GS}$) and the drain-to-source voltage ($V_{DS}$) of the transistor. In a CMOS process, this variation in "on" resistance can be reduced by placing an n-channel device in parallel with a p-channel device and driving the gates of the parallel devices with complementary control signals. Nevertheless, very large devices typically are required to achieve a sufficiently low "on" resistance of the pass transistors. The use of large MOS devices, however, results in a large input capacitance change between the "on" and "off" states of the T-switch, a large disabled output capacitance of the T-switch, and a substantial charge injection when an output of a multiplexer switches channels. These characteristics limit the fan-in of a multiplexer, i.e., the number of inputs that may be multiplexed into the output of the multiplexer, and may cause distortion and/or noise glitches at the outputs thereof.

Another option for implementing an n:1 multiplexer is to enable selectively one of a group of "n" amplifiers (or buffers), with outputs of all "n" amplifiers being connected together and each amplifier receiving a separate input signal. Each of the switched amplifiers in such a configuration thus behaves as a unidirectional switch. Since (typically) only one amplifier is on at any one time, power consumption will be minimized in a multiplexer using such switched amplifiers.

If closed-loop "switched" amplifiers are used as unidirectional switches, such switches will have a relatively high input impedance and a relatively low on-state output impedance as compared to transistor switches. Because individual closed-loop amplifiers typically are die area intensive, however, the number of closed-loop amplifiers that may be used to implement a switched amplifier multiplexer may be limited due to "real estate" concerns. Additionally, the output capacitances of closed-loop amplifiers (in their disabled state) typically are large due to the large output devices employed by the amplifiers. The resulting capacitive loading at the output of any given amplifier thereby places limits on the bandwidth and fan-in of the n:1 multiplexer. Also, the switching time and glitching of an n:1 multiplexer using closed-loop amplifiers are compromised by the large number of devices that must change state when a particular amplifier is enabled or disabled.

If "switched" open-loop buffers are used (instead of closed-loop amplifiers), the resulting unidirectional switches also will have a high input impedance (as compared with transistor switches) and a relatively low output impedance (typically tens of ohms). In contrast with switched closed-loop amplifiers, open-loop buffers are compact (i.e., consume a minimal amount of real estate) and have a low output capacitance when disabled, thereby increasing the fan-in capability of the n:1 multiplexer. Further, relatively "compact" open-loop buffer multiplexers do not suffer from the aforementioned switching time and glitch problems (encountered with switched closed-loop amplifier multiplexers).

Disadvantages occur, however, due to the open-loop nature of the buffers. Although the distortion caused by the non-zero output resistance of an open-loop buffer is tolerable when the buffer is driving only a moderate load, when directly driving a video load, the quiescent current that would be required to attain low distortion would be prohibitively high for use in a low power application. Although such a gain error problem could be remedied by buffering the output of the open-loop buffer multiplexer with a closed-loop amplifier, such an approach would result in a topology that is more area intensive and less power efficient than even a switched-amplifier approach.

Yet another circuit that may be used to select a single output from a plurality of inputs (i.e., a multiplexer) is a switched-transconductance multiplexer. An example of a switched-transconductance 2:1 multiplexer (configured for unity gain) is shown in FIG. 2. As shown, decoder 30, responsive to a select signal, steers a fixed tail-current, i.e., a constant current that drives a differential pair of input transistors, to one of two transconductance circuits (i.e., either transconductance circuit GM0 or transconductance circuit GM1), thereby enabling the transconductance circuit that receives the fixed tail-current. The output of the selected transconductance circuit is a differential current which, in this example, is converted into a single-ended current by a current mirror comprised of transistors Q115 and Q116 and integrated by capacitor C1 and high-gain amplifier A1. The output of amplifier A1 is buffered by unity gain buffer A2 and fed back to the inverting inputs of both transconductance circuits. The high loop-gain of such a switched-transconductance circuit minimizes the error between the selected input and the output.

The switched-transconductance multiplexer topology (such as that shown in FIG. 2) offers several of the advantages offered by switched-amplifier multiplexers. That is, relative to transistor switches, a switched-transconductance multiplexer has a substantially higher input impedance, lower output impedance, lower distortion, higher output-drive capability and selectable gain. Additionally, the disabled output capacitance of a switched-transconductance multiplexer also is lower than that of switched-amplifier topology (since the multiplexing function is accomplished internally) and only the input stages are replicated, thereby increasing the compactness of the multiplexer. Also, since changing the selected input involves the switching of only a few input devices, switching times are reduced and smaller glitches are encountered than with a switched-amplifier architecture. Further, since only one of the transconductance circuits is enabled at any given time, the power dissipation of the circuit is little more than that of a single amplifier.

Ideally, signals applied to the inputs of unselected transconductance circuits in a switched-transconductance multiplexer would not influence the output of the multiplexer. Parasitic capacitances, however, caused by the wiring of the circuit and the reverse-biased junctions of the input transistors in the unselected transconductance circuits (e.g., transistors Q111 and Q112 in FIG. 2) tend to act as high-pass conduction paths between the unselected inputs and the output of the multiplexer. Although the parasitic capacitances caused by the circuit's wiring may be reduced by optimizing the circuit layout, at high frequencies, the parasitic capacitances of the input transistors in the unselected transconductance circuits may still permit undesirable crosstalk between the unselected inputs and the output which, in turn, places an upper limit on the bandwidth of the switched-transconductance multiplexer.

One circuit designed to reduce the crosstalk between unselected and selected channels in a multiplexer (caused by the parasitic capacitances of input transistors in the unselected transconductance circuits) is shown in FIG. 3. As shown, each of transistors Q105 and Q106 comprises one half of a differential pair of input transistors, while both of transistors Q105 and Q106 share transistor Q107 as the second half of each of the respective differential pairs. The signals on each of select lines $\overline{SEL0}$ and $\overline{SEL1}$ determine which, if either, of transistors Q105 and Q106 is enabled at any given time. That is, if either of select lines $\overline{SEL0}$ and $\overline{SEL1}$ is asserted (i.e., a logic high signal is placed thereon), then the transistor(s) receiving the logic high signal (i.e., transistor Q103 and/or Q104) will be turned on.

If transistor Q103 is turned on, then the biasing current from current source 68 will be steered away from the emitter of transistor Q101, thereby reverse biasing transistors Q101 and Q105. Similarly, if transistor Q104 is turned on, then the biasing current from current source 70 will be steered away from the emitter of transistor Q102, thereby reverse biasing transistors Q102 and Q106. If either of transistors Q103 or Q104 is not turned on, however, then a second half of the differential pair of input transistors (i.e., transistor Q105 or Q106, respectively) will be enabled and an input signal at the base of the emitter follower connected thereto (i.e., transistor Q101 or Q102, respectively) will be processed by the differential pair.

When a particular input is not selected, a corresponding one of transistors Q103 and Q104 will provide a low impedance path from the base of the non-selected one of the differential pair of input transistors to ground. The resulting T-switch-like structure, i.e., a structure resembling a T-switch, has the advantage of bypassing both the emitter-base and collector-base capacitances of the non-selected input transistor. The presence of emitter followers Q101 and Q102, however, increases the power consumption of the circuit since they must be provided with high bias currents (from current sources 68 and 70, respectively). Additionally, the input followers (i.e., transistors Q101 and Q102) cause an uncompensated voltage offset (i.e., approximately one base-to-emitter voltage drop ($V_{BE}$)) to appear between the inputs of the differential pair and may increase noise and/or decrease the bandwidth of the circuit. Although the voltage offset could be compensated by including a feedback follower in the circuit, such an addition would further increase the power dissipation of the circuit.

It therefore is a general aim of the invention to provide a switched-transconductance circuit with improved off-state isolation and reduced voltage offset. It is an additional aim of the invention to provide a high-isolation switched-transconductance circuit with low power consumption.

SUMMARY OF THE INVENTION

According to one aspect of the present invention, a transconductance circuit and a method for using the circuit are disclosed. A transconductance stage receives an input voltage and, if enabled, provides an output current to an output node having an amplitude that is proportional to an amplitude of the input voltage. A switch is coupled between the output node of the transconductance stage and a constant voltage node. The switch is used to establish selectively a low impedance path, e.g., a few ohms, from the output node of the transconductance stage to the constant voltage node.

According to yet another aspect, the transconductance circuit further includes an additional switch coupled between the output node of the transconductance stage and an output node of the transconductance circuit. The additional switch is used to establish selectively a low impedance path from the output node of the transconductance stage to an output node of the transconductance circuit.

According to another aspect, the transconductance circuit further includes an additional transconductance stage that also receives an input voltage and, if enabled, provides an output current having an amplitude that is proportional to the input voltage. The transconductance circuit according to this aspect also includes an additional circuit stage that receives the output currents from enabled ones of the two transconductance stages and provides an output voltage that is proportional to a combination of the two output currents.

According to an additional aspect, another transconductance circuit and method for using the circuit are disclosed. The circuit includes a differential pair of input transistors having current nodes coupled to a common node, and a switch coupled between the common node of the differential pair and a constant voltage node. The switch is used to establish selectively a low impedance path, e.g., a few ohms, from the common node of the differential pair to the constant voltage node.

DETAILED DESCRIPTION OF THE INVENTION

Figure 1:
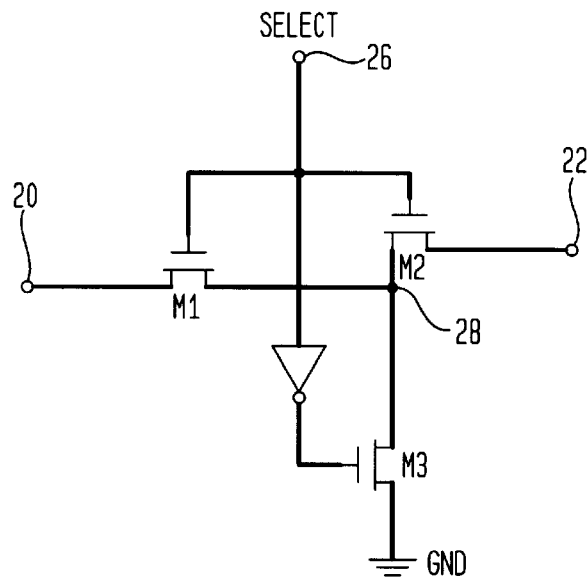
FIG. 1 is a schematic diagram of a basic prior art T-switch.
Figure 2:
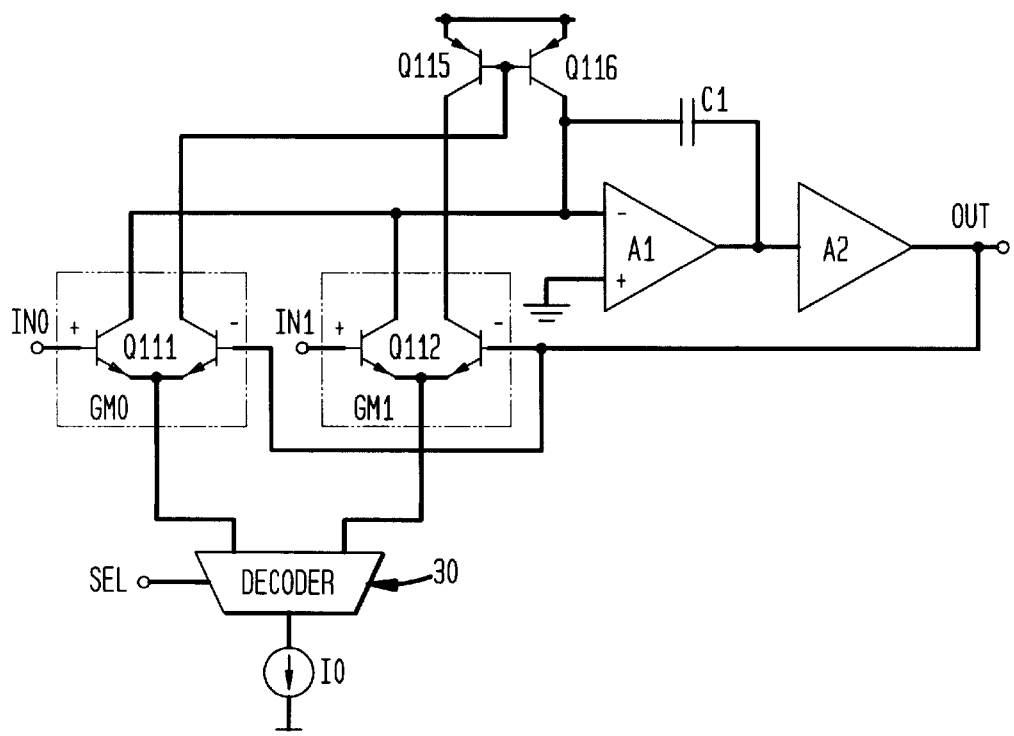
FIG. 2 is a partial block/partial schematic diagram of a prior art switched-transconductance multiplexer circuit.
Figure 3:
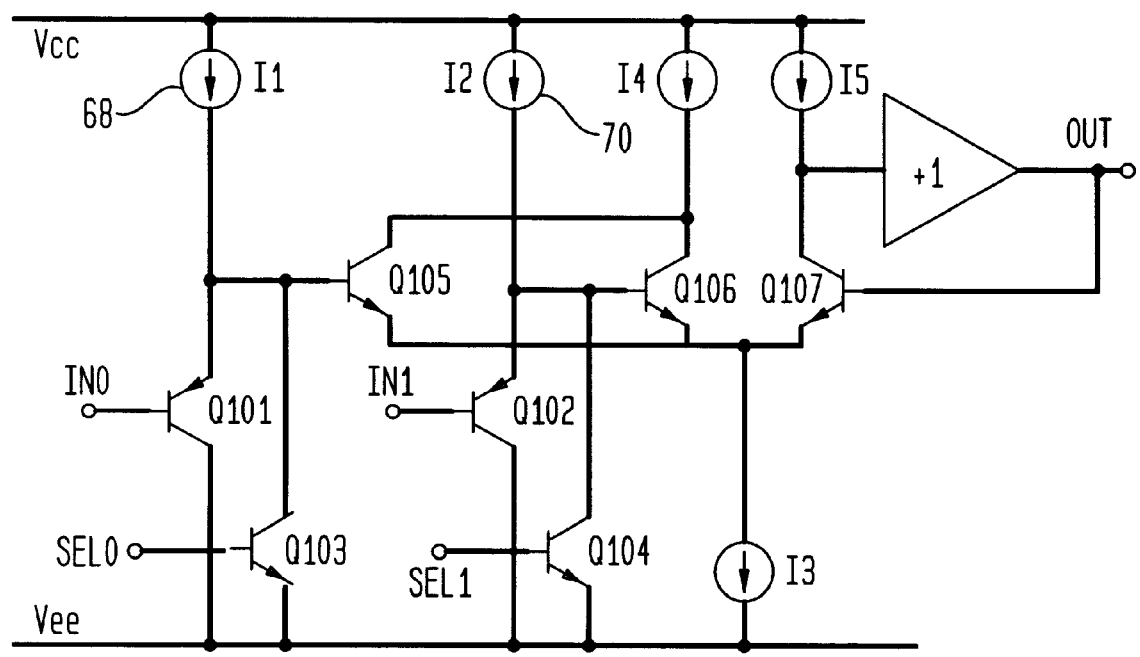
FIG. 3 is a partial block/partial schematic diagram of a prior art transconductance circuit that employs an integrated input T-switch.
Figure 4:
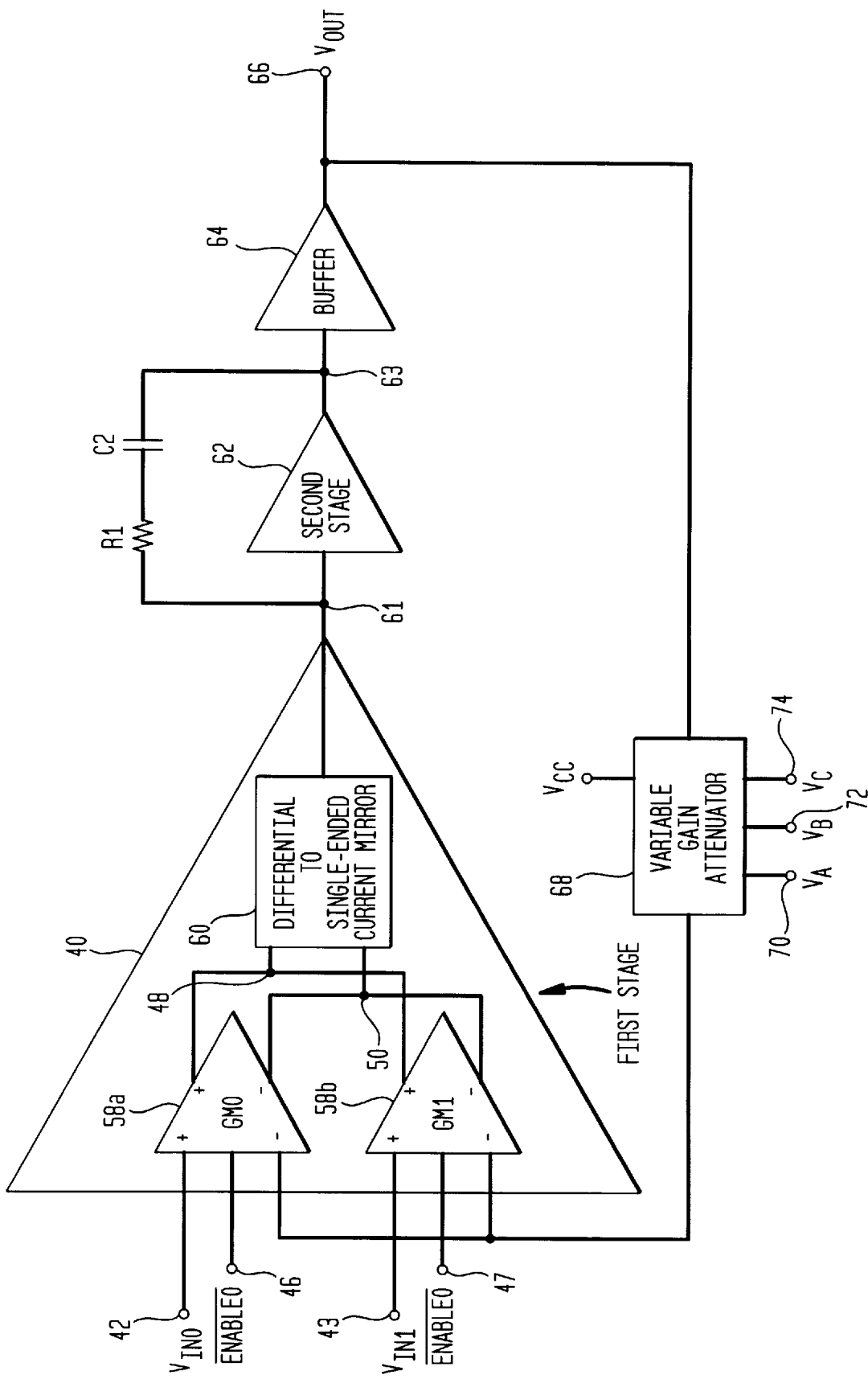
FIG. 4 is a partial block/partial schematic diagram of a switched-transconductance circuit according to one embodiment of the invention.

FIG. 4 is a partial block/partial schematic diagram of a switched-transconductance multiplexer circuit according to the invention. As shown, the circuit comprises a two-stage commutating programmable-gain operational amplifier (op-amplifier) including a first stage 40, a second stage 62, a buffer 64 and a variable gain attenuator 68. The function of a typical two-stage op-amplifier is explained in detail in a paper written by James E. Solomon, entitled "The Monolithic Op Amplifier: A Tutorial Study," *IEEE J. Solid-State Circuits,* vol. SC-9, pp. 314–332, December 1974, which is incorporated herein by reference.

A commutating function is performed by first stage 40, which includes two identical switched-transconductance stages 58a and 58b that share a single differential-to-single-ended current mirror 60. Each of switched transconductance stages 58a and 58b receives a distinct input voltage VIN0 or VIN1 (from input node 42 or 43, respectively) at its respective non-inverting input node. Differential current outputs of each of transconductance stages 58a and 58b are connected to the inputs of current mirror 60 such that either of the transconductance stages, if enabled, may drive the output of first stage 40. Transconductance stages 58a and 58b are enabled by providing low, i.e., zero volt, control signals $\overline{\text{ENABLE0}}$ and $\overline{\text{ENABLE1}}$ at control nodes 46 and 47, respectively. Additional transconductance stages also could be included in first stage 40, with each of the additional transconductance stages being enabled by a distinct control signal and having its differential current outputs connected to the inputs of shared current mirror 60.

The single-ended current output of first stage 40 is fed to second stage 62, which commonly is known as the "voltage gain stage" of a two-stage op-amplifier. Second stage 62 is frequency compensated by resistor R1 and capacitor C2, which are connected in series between the output and input of second stage 62 (i.e., between nodes 63 and 61). The output of second stage 62 then is fed to buffer 64, which provides an output voltage $V_{OUT}$ to output node 66.

The output of buffer 64 also is fed back through variable gain attenuator 68 to the inverting input nodes of both of transconductance stages 58a and 58b. By providing voltage signals VA, VB or VC to attenuation control nodes 70, 72, or 74, respectively, the attenuation of variable gain attenuator 68 may be adjusted, for example, by switching resistors between output node 66, the inverting inputs of transconductance stages 58a and 58b, and positive voltage supply node 76, thereby adjusting the voltage gain of the circuit. In this manner, by properly controlling variable gain attenuator 68, a voltage gain may be provided, for example, between input node 42 and output node 66 (when transconductance stage 58a is enabled) that is different than the voltage gain that is provided between input node 43 and output node 66 (when transconductance stage 58b is enabled).

If only one of transconductance stages 58a and 58b is enabled at any given time (such that only the input voltage at the input node of the selected one of the transconductance stages influences the output voltage at output node 66), then the circuit shown in FIG. 4 performs as a two-to-one switched-transconductance multiplexer that is capable of providing different voltage gains between each of the individual inputs and the output of the multiplexer.

Figure 5:
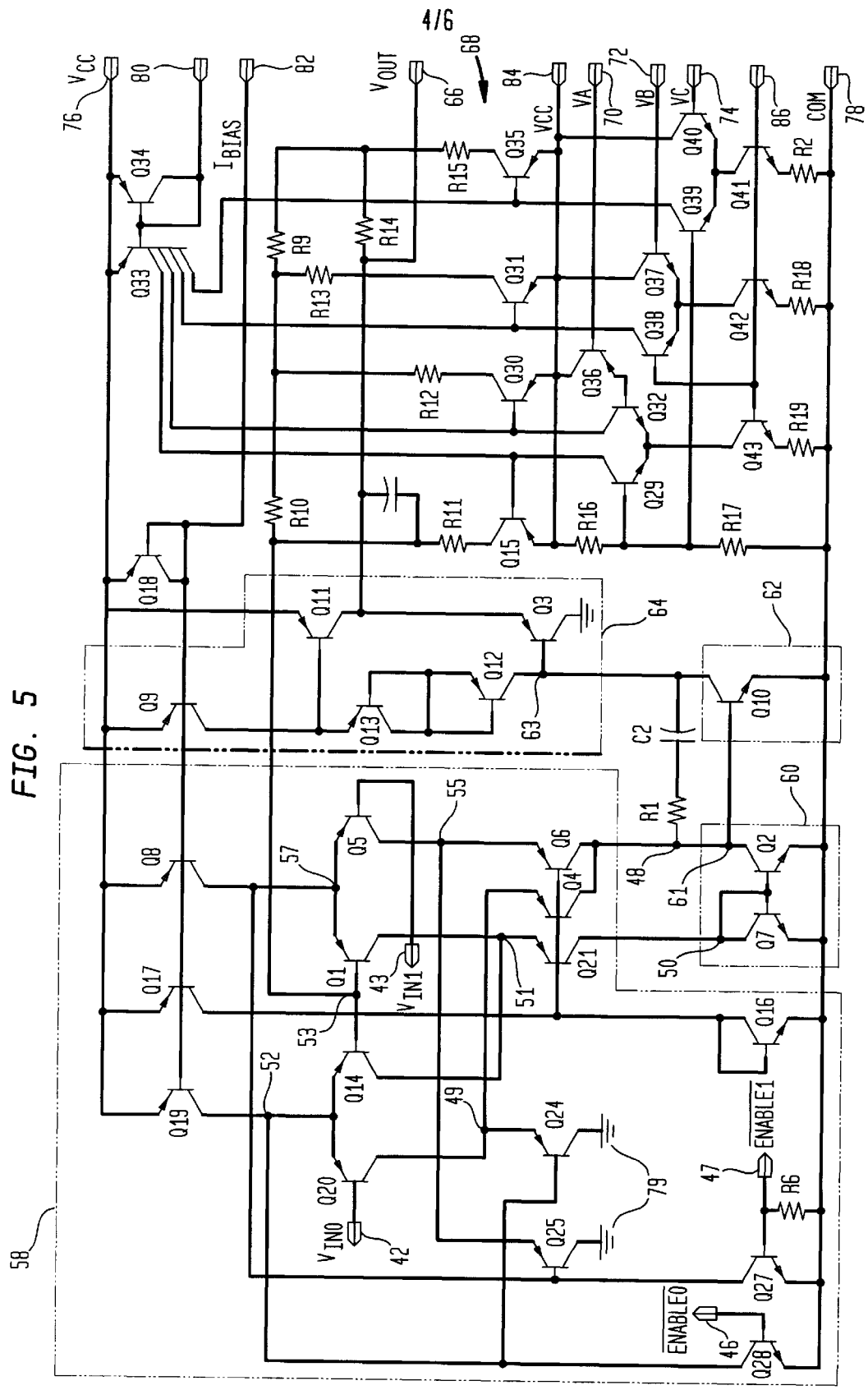
FIG. 5 is a schematic diagram of one embodiment of the switched-transconductance circuit of FIG. 4.

FIG. 5 is a schematic diagram of one embodiment of the circuit shown in FIG. 4, in which like reference numerals refer to identical circuit nodes or elements. Referring to FIG. 5 in conjunction with FIG. 4, portion 58 of the FIG. 5 embodiment includes circuit elements of each of transconductance stages 58a and 58b (FIG. 4). In the FIG. 5 embodiment, transconductance stage 58a includes a differential pair of PNP transistors Q20 and Q14 connected at a common emitter node and driven by a current source PNP transistor Q19 (which forms a PNP current mirror in conjunction with diode connected PNP transistor Q18). Emitters and collectors of transistors are referred to herein (alternatively) as current nodes of transistors, while bases of transistors are referred to (alternatively) as control nodes thereof.

Transconductance stage 58a also includes a cascode PNP transistor Q4 connected between output node 49 (i.e., the collector of transistor Q20), and output node 48 (which is connected to an input of differential-to-single-ended current mirror 60), and a cascode PNP transistor Q21 connected between output node 51 (i.e., the collector of transistor Q14), and output node 50 (which is connected to the other input of differential-to-single-ended current mirror 60). For ease of implementation, cascode transistor Q21 and output node 51 are shared with transconductance stage 58b (described below). Both of cascode transistors Q4 and Q21 are biased at their bases by a voltage created by a current from current source transistor Q17 flowing through diode-connected transistor Q16.

Transconductance stage 58a further includes a PNP switch transistor Q24 and an NPN switch transistor Q28. When the signal $\overline{\text{ENABLE0}}$ at node 46 is low, transistors Q24 and Q28 will be turned off and transistors Q4 and Q21 will be turned on. In this state, the current from current source transistor Q19 will drive the differential pair of input transistors Q14 and Q20 and a differential voltage across input nodes 42 and 53 (i.e., between the bases of differential input transistors Q20 and Q14, respectively) will cause a differential current (that is proportional to the differential voltage across the input nodes) to flow between output nodes 49 and 51. Also, since transistors Q4 and Q21 are turned on, a differential voltage across input nodes 42 and 53 will cause a differential current (that is proportional to the differential voltage) to flow between output nodes 48 and 50. Additionally, because no additional circuit elements are present between input nodes 42 and 53 and the respective bases of transistors Q20 and Q14, a negligible input voltage (i.e., zero volts presented across inputs 42 and 53) will produce only a negligible output current (i.e., an output current equal to or less than that due to the mismatch between input transistors Q20 and Q14), between output nodes 49 and 51.

When the signal $\overline{\text{ENABLE0}}$ goes high, however, transistor Q28 will turn on and steer the current created by transistor Q19 away from the common-emitter node of differential input transistors Q14 and Q20, which will disable this differential pair. Also, when transistor Q28 is turned on, it will saturate and the voltage at its collector will go low, thereby causing transistor Q24 to turn on. The turning on of transistor Q24, in turn, causes the voltage at the emitter thereof to go low, thereby causing transistor Q4 to turn off. The placement and control of switch transistors Q4, Q24 and Q28 in this manner serves to increase the isolation between input node 42 and the rest of the circuit, as is explained in detail below.

Similarly, in the FIG. 5 embodiment transconductance stage 58b includes a differential pair of PNP transistors Q1 and Q5 connected at a common emitter node. This differential pair is driven by a current source PNP transistor Q8 (which forms a PNP current mirror in conjunction with diode connected PNP transistor Q18).

Transconductance stage 58b also includes a cascode PNP transistor Q6 connected between output node 55 (i.e., the collector of transistor Q5), and output node 48. Shared cascode PNP transistor Q21 is connected between shared output node 51 (i.e., the collector of transistor Q1), and output node 50 (which is connected to the other input of differential-to-single-ended current mirror 60). Both of cascode transistors Q6 and Q21 are biased at their bases by a voltage created by the current from current source transistor Q17 flowing through diode-connected transistor Q16.

Transconductance stage 58b also includes a PNP switch transistor Q25 and NPN switch transistor Q27. When the signal $\overline{\text{ENABLE1}}$ at node 47 is low, transistors Q25 and Q27 will be turned off and transistors Q6 and Q21 will be turned on. Thus, the current from current source transistor Q8 will drive the differential pair of input transistors Q1 and Q5, and a differential voltage applied across input nodes 43 and 53 (i.e., between the bases of differential input transistors Q5 and Q1, respectively), will cause a differential current (that is proportional to the differential voltage across the input nodes) to flow between output nodes 55 and 51. Also, since transistors Q6 and Q21 are turned on, a differential voltage applied across input nodes 43 and 53 will cause a differential current (that is proportional to the differential voltage) to flow between output nodes 48 and 50.

When the signal $\overline{\text{ENABLE1}}$ is high, however, transistor Q27 will turn on and steer the current created by transistor Q8 away from the common-emitter node of differential input transistors Q1 and Q5, which will disable this differential pair. Also, when transistor Q27 is turned on, it will saturate and the voltage at its collector will go low, thereby causing transistor Q25 to turn on. The turning on of transistor Q25, in turn, causes the voltage at the emitter thereof to go low, thereby causing transistor Q6 to turn off. The placement of switch transistors Q6, Q25 and Q27 in this manner serves to increase the isolation between input node 43 and the rest of the circuit, as is explained in detail below.

Still referring to FIG. 5 in conjunction with FIG. 4, differential-to-single-ended current mirror 60 includes NPN transistors Q2 and Q7. Specifically, the anode and cathode of diode-connected transistor Q7 are connected to output node 50 and common-node 78, respectively. Output node 50 drives the base of transistor Q2, which has its emitter connected to common-node 78 and its collector connected to output node 48.

Second stage 62, i.e., the voltage gain stage, includes NPN transistor Q10. As shown, the current at node 61, which comprises the sum of the currents from output node 48 and the mirrored current from output node 50, drives the base of transistor Q10. Capacitor C2 and resistor R1 are connected in series between the collector and the base of transistor Q10 (i.e., between the output and input of second stage 62), to frequency compensate second stage 62.

Unity-gain buffer 64 comprises a PNP transistor Q3, an NPN transistor Q11, NPN and PNP diode-connected transistors Q12 and Q13, respectively (connected in series between the bases of transistors Q3 and Q11), and a current source PNP transistor Q9 (forward biasing diode-connected transistors Q12 and Q13). The common-emitter node of transistors Q3 and Q11 is connected to output node 66, which provides the output voltage VOUT. Buffer 64 thus forms a class AB output emitter follower that provides low impedance drive to the load.

Still referring to FIG. 5 in conjunction with FIG. 4, variable gain attenuator 68 includes differential pairs of NPN transistors (Q29 and Q32), (Q38 and Q37), and (Q39 and Q40), driven by current sources Q43, Q42 and Q41, respectively. The currents provided by these current sources are controlled by a voltage at biasing node 86. A constant voltage is provided to the base of one the transistors in each of the differential pairs of transistors included in the variable gain attenuator. This voltage is established by a voltage division performed by resistors R16 and R17 connected in series between a high supply node 84 and common-node 78.

Variable gain attenuator 68 functions as follows. When a low voltage VA is applied to attenuation control node 70, the current though transistor Q32 will be low enough that switch transistor Q15 remains turned off, and the current through transistor Q29 will be large enough that switch transistor Q30 remains turned on. As the voltage VA at attenuation control node 70 increases, however, the current through transistor Q32 will increase and the current through transistor Q29 will decrease. This increasing current through transistor Q32 and decreasing current through transistor Q29 will, in turn, cause switch transistor Q15 to turn off and switch transistor Q30 to turn on. By selectively turning on each of switch transistors Q15 and Q30, resistors R11 and R12 may selectively be connected between respective nodes of a resistors ladder including resistors R14, R9 and R10 (which are connected in series between output node 66 and the inverting inputs of transconductance stages 58a and 58b) and high supply node 84. Because resistors R11 and R12 thus are switched into the circuit between output node 66 and high supply node 84, the attenuation in the feedback path of the circuit is adjusted simply by applying a high or low voltage to attenuation control node 70.

Similarly, when the voltages at attenuation control nodes 72 and 74 are low, e.g., zero volts, the currents flowing through transistors Q38 and Q39 will be low enough that switch transistors Q31 and Q35 remain turned off. When the voltage at one of attenuation control nodes 72 and 74 is increased sufficiently, however, the current flowing through transistor Q38 or transistor Q39, respectively, will increase such that switch transistor Q31 or switch transistor Q35 will turn on. Thus, by properly controlling the voltages at nodes 72 and 74, each of resistors R13 and R15 also may be selectively connected between the nodes of the resistor ladder including resistors R15, R9 and R10 and high supply node 84, thereby further adjusting the attenuation in the feedback path of the circuit.

The presence of variable gain attenuator 68 thus provides a distinct advantage in the circuit shown in FIGS. 4 and 5 in that a different gain setting may be selected when either of transconductance stages 58a and 58b is enabled.

Referring still to FIGS. 4 and 5, the isolation between the non-selected input (i.e., one of non-inverting inputs 42 and 43) and output 66 of the switched-transconductance circuit now will be explained. Transconductance stages 58a and 58b each include a pair of (effective) T-switches integrated into the circuit. In transconductance stage 58a, a first T-switch type circuit is located between non-inverting input 42 and output node 48; and in transconductance stage 58b, a first T-switch type circuit is located between non-inverting input 43 and output node 48. Each of these first T-switch type circuits, when its respective transconductance stage is disabled, isolates an input of its respective transconductance stage (i.e., input 42 or input 43), from an output of that stage (i.e., output node 48), through two disabled transistors (i.e., differential input transistor Q20 and cascode transistor Q4 or differential input transistor Q5 and cascode transistor Q6, respectively), with a low impedance path being established (through transistor Q24 or Q25, respectively) from a point between the two disabled transistors (i.e., output node 49 or 51, respectively) to a constant voltage node (i.e., ground node 79).

Each of transconductance stages 58a and 58b also includes a second T-switch-like circuit located between its non-inverting input and its inverting input (which is coupled via a resistor ladder to output node 66). Each of these second T-switch-like circuits, when its respective transconductance stage is disabled, isolates its non-inverting input (i.e., input 42 or input 43), from its inverting input through two disabled transistors (i.e., differential input transistors Q14 and Q20 or differential input transistors Q1 and Q5, respectively), with a low impedance path being provided from a point between the two disabled transistors (i.e., from common-emitter node 52 or common-emitter node 57), to a constant voltage node (i.e., common-node 78).

When either of transconductance stages 58a or 58b are enabled, however, it will behave as an ordinary differential pair of input transistors (i.e., differential input transistors Q14 and Q20 or differential input transistors Q1 and Q5, respectively) having cascode transistors (i.e., cascode transistors Q21 and Q4 or cascode transistors Q21 and Q6, respectively) connected to the outputs (i.e., output nodes 51 and 49 or output nodes 51 or 55, respectively) thereof.

Figure 6:
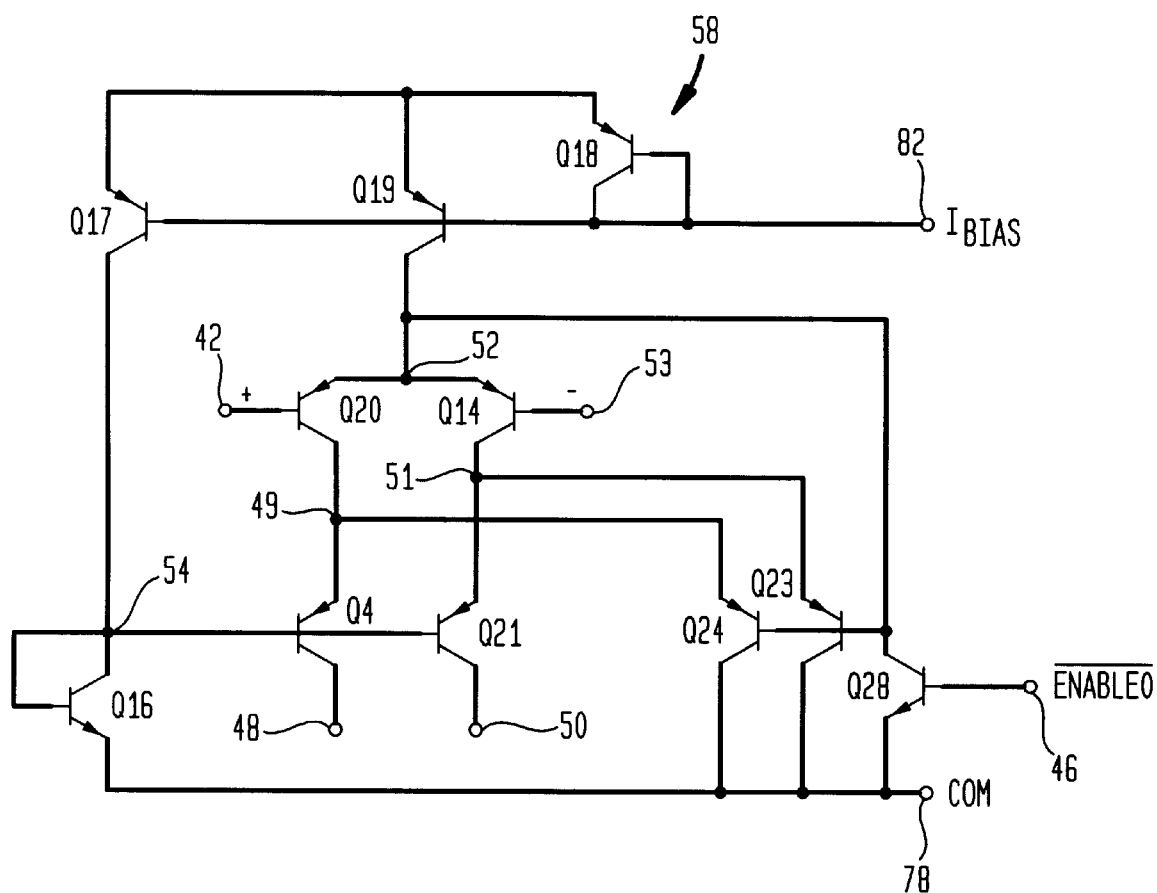
FIG. 6 is a schematic diagram of an embodiment of a single transconductance stage of the switched-transconductance circuits of FIGS. 4 and 5.

FIG. 6 is a schematic diagram showing only transconductance stage 58a (shown in FIGS. 4 and 5), in which like reference numerals refer to identical circuit nodes or elements. As shown, a differential pair of PNP input transistors Q14 and Q20 have bases that are connected, respectively, to inverting input 53 and non-inverting input 42 of transconductance stage 58a. The differential pair of input transistors Q14 and Q20 have respective current nodes (i.e., emitters) coupled to a common node 52. The differential pair is driven by a current from a current mirror comprising transistors Q18 and Q19, which current mirror receives an enabling bias current $I_{BIAS}$ at control node 82. Specifically, the collector of current-mirror transistor Q19 is coupled to common-emitter node 52 so as to provide a biasing current to the differential pair.

Thus, the differential pair of input transistors Q14 and Q20 form a transconductance circuit having differential voltage inputs 42 and 53 to receive an input voltage thereacross. The collectors of transistors Q20 and Q14 (i.e., nodes 49 and 51, respectively) may be considered to be output nodes of the transconductance circuit since a differential current will flow therebetween that is proportional to the voltage placed across inputs 42 and 53.

Another current mirror comprising PNP transistors Q17 and Q18 also is driven by bias current $I_{BIAS}$ to provide a current (from the collector of current mirror transistor Q7) through diode-connected NPN transistor Q16. This current flowing through diode-connected transistor Q16 will create a voltage at node 54 that is approximately one base-to-emitter voltage drop ($V_{BE}$) above the voltage at common-node 78.

PNP cascode transistors Q4 and Q21 are connected, respectively, between output nodes 49 and 51 and output nodes 48 and 50. Specifically, the emitter of cascode transistor Q4 is connected to the collector of input transistor Q20 and the collector of cascode transistor Q4 is connected to output node 48. Similarly, the emitter of cascode transistor Q21 is connected to the collector of input transistor Q14 and the collector of cascode transistor Q21 is connected to output node 50. Because the bases of both of cascode transistors Q4 and Q21 are connected to node 54, which has a voltage thereon that is approximately one $V_{BE}$ above the voltage at common-node 78, these transistors will act as switches that will remain "turned on" so long as the voltages at the emitters of cascode transistors Q4 and Q21 remain at (approximately) two base-to-emitter voltage drops above the voltage at common-node 78. Thus, when the transconductance circuit is enabled (and cascode transistors Q4 and Q21 are turned on), output nodes 48 and 50 will provide a differential output current that is proportional to the voltage across input nodes 42 and 53.

The embodiment of transconductance stage 58a shown in FIG. 6 does differ from that shown in FIG. 5 in that it includes an additional PNP switch transistor Q23 connected between the collector of differential input transistor Q14 and common-node 78. This switch transistor is not included in the embodiment shown in FIG. 5 because an input signal is applied only to input 42 (and not input 53) in that embodiment and it therefore is not required that input 53 be isolated from output node 50 (by means of a low impedance path through switch transistor Q23 to common-node 78, as explained below).

Referring still to FIG. 6, transistor Q28 (having its base connected to control node 46) is connected between common-emitter node 52 and common-node 78, i.e., a constant voltage node. Specifically, the collector of transistor Q28 is connected to common-emitter node 52 and the emitter of transistor Q28 is connected to common-node 78.

Additionally, PNP transistor Q23 (having its base connected to the collector of transistor Q28) is connected between the collector of transistor Q14 (i.e., one of the output nodes of the transconductance circuit) and common-node 78 (i.e., a constant voltage node). Specifically, the emitter of transistor Q23 is connected to the collector of transistor Q14 and the collector of transistor Q23 is connected to common-node 78.

Similarly, transistor Q24 (also having its base connected to the collector of transistor Q28) is connected between the collector of transistor Q20 (i.e., the other one of the output nodes of the transconductance circuit) and common-node 78 (i.e., a constant voltage node). Specifically, the emitter of transistor Q24 is connected to the collector of transistor Q20 and the collector of transistor Q24 is connected to common-node 78. In practice, as shown in the embodiment of FIG. 5, transistors Q23 and Q24 may be implemented as substrate PNP transistors, i.e., their collectors may be tied to the substrate of the circuit (which may be electrically connected to ground).

The value of the signal $\overline{\text{ENABLE0}}$ at control node 46 determines whether transconductance circuit 58a is enabled or disabled. That is, when the signal $\overline{\text{ENABLE0}}$ is low, i.e., less than a predetermined voltage (e.g., one $V_{BE}$ above the voltage at common-node 78), the transconductance circuit will be enabled, and when the signal $\overline{\text{ENABLE0}}$ is high, i.e., greater than a predetermined voltage (e.g., one $V_{BE}$ above the voltage at common-node 78), the transconductance circuit is disabled.

More specifically, when the signal $\overline{\text{ENABLE0}}$ is low, transistor Q28 is turned off, i.e., the base-emitter junction of transistor Q28 is reverse or zero biased, which forces the current from current-mirror transistor Q19 to drive the differential pair of input transistors Q14 and Q20, thereby enabling the transconductance circuit. Also, since transistor Q28 is off in this state, the voltage at the collector of transistor Q28 (which controls the bases of transistors Q23 and Q24 and is by definition the voltage at common-emitter node 52) will be greater than the voltages at the collectors of transistors Q14 and Q20 (because of the necessary voltage drop between the emitter and collector of each of differential input transistors Q14 and Q20), so transistors Q23 and Q24 will remain turned off when the transconductance circuit is enabled. Thus, when the signal $\overline{\text{ENABLE0}}$ is low, the circuit shown in FIG. 6 will behave as an ordinary transconductance circuit.

When the signal $\overline{\text{ENABLE0}}$ is high, however, transistor Q28 is turned on, i.e., its emitter-base junction is forward biased. The turning on of transistor Q28, in turn, will steer the biasing current (from the collector of current-mirror transistor Q19) through transistor Q28 to common-node 78, and thus, will pull the voltage at common-emitter node 52 to a voltage just above the voltage at common-node 78, i.e., transistor Q28 is saturated. This redirecting of the biasing current, then, causes the differential pair of input transistors Q14 and Q20 to be disabled, thereby disabling the transconductance circuit. The pulling low of the collector of transistor Q28 (which is connected to the bases of transistors Q23 and Q24) also will turn on transistors Q23 and Q24 when the transconductance circuit is disabled.

Additionally, the turning on of transistors Q23 and Q24 (such that they are at or near saturation) pulls the emitters of cascode transistors Q21 and Q4, respectively, to a voltage just above the voltage at common-node 78. Cascode transistors Q23 and Q24 therefore will remain turned off when transconductance stage 58a is disabled. Thus, transistors Q23 and Q24 act as switches that are enabled only when transconductance stage 58a is enabled.

Hence, when transconductance stage 58a is disabled: (1) transistors Q14 and Q20 will be disabled such that only high-frequency signals, e.g., greater than 1 MHZ, at inputs 42 and 53 will pass through the base-collector parasitic capacitances of transistors Q14 and Q20; (2) transistors Q23 and Q24 will be turned on, thereby shunting such high frequency signals (passing through the parasitic capacitances of transistor Q14 and Q20) to common-node 78; and (3) transistors Q21 and Q4 will be turned off (further isolating input nodes 53 and 42 from output nodes 50 and 48, respectively).

Further, when transconductance stage 58a is disabled, reverse-biased differential input transistors Q14 and Q20, in combination with the low-impedance path established (via switch transistor Q28) between common-emitter node 52 and common-node 78, form a high-isolation T-switch-type arrangement between input nodes 42 and 53. Thus, high-frequency signals, e.g., greater than 1 MHZ, that manage to pass through the parasitic emitter-base capacitances of transistors Q14 or Q20 will be shunted to common-node 78 through switch transistor Q28 (rather than passing through to the opposite input) when transconductance stage 58a is disabled.

Figure 7:
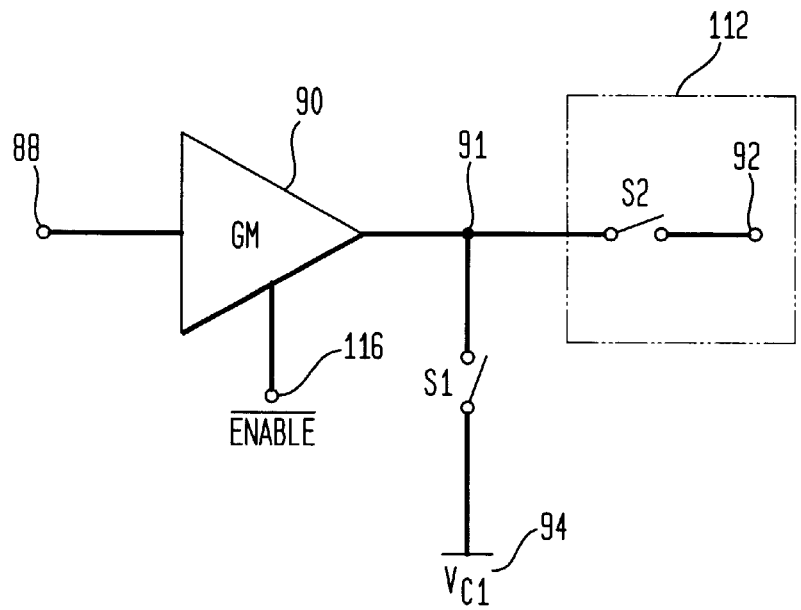
FIG. 7 is a block diagram of an embodiment of a transconductance circuit according to the invention.

Referring now to FIG. 7, a simplified block diagram of an embodiment of the invention is shown. The embodiment shown in FIG. 7 could, for example, correspond to transconductance circuit 58a (shown in FIG. 6) in the following manner: (1) input node 88 (FIG. 7) could correspond to one of input nodes 42 and 53 (FIG. 6); (2) transconductance stage 90 (FIG. 7) could correspond to differential input transistors Q14 and Q20 driven by current source transistor Q19 (FIG. 6); (3) enabling input 116 (FIG. 7) could correspond to control node 46 (FIG. 6); (4) output node 91 (FIG. 7) could correspond to a respective one of output nodes 49 and 51 (FIG. 6); (5) switch S1 (FIG. 7) could correspond to a respective one of switch transistors Q24 and Q23 (FIG. 6); (6) switch S2 (FIG. 7) could correspond to a respective one of switch transistors Q4 and Q21 (FIG. 6); and (7) output node 92 (FIG. 7) could correspond to a respective one of output nodes 48 and 50 (FIG. 6).

Transconductance stage 90 is adapted to receive an input voltage from input node 88 and to provide an output current at output node 91 having an amplitude that is proportional to an amplitude of the input voltage. Also, transconductance stage 90 is configured such that it may be enabled selectively when a control signal $\overline{\text{ENABLE}}$ is applied to enabling input 116 thereof. Switch S1 is coupled between output node 91 and constant voltage node 94 (which is kept at a constant voltage VC1), and switch S2 may be coupled between output node 91 of transconductance stage 90 and output node 92 of the transconductance circuit.

By operating switches S1 and S2 properly, a high degree of isolation is attained between input node 88 and output node 92 when transconductance stage 90 is not enabled. That is, when transconductance stage 90 is enabled, switch S1 is kept open (i.e., it is deactivated, disabled, or turned off)

and switch S2 is kept closed (i.e., it is activated, enabled, or turned on), and when transconductance stage 90 is disabled, switch S1 is closed and switch S2 is opened. In this manner, a low impedance path is established between output node 91 and output node 92 when transconductance stage 90 is enabled, and T-switch type isolation is provided between input node 88 and output node 92 when transconductance stage 90 is disabled.

It should be noted that portion 112 of the circuit shown in FIG. 7 is not essential to the invention, as this portion 112 could be implemented separately, e.g., on a separate integrated circuit. The portion of the circuit shown in FIG. 7 that does not include portion 112 is useful because it may be employed in conjunction with another circuit, such as portion 112, to provide isolation between an input and an output of a transconductance circuit when a transconductance stage in the circuit is disabled.

Figure 8:
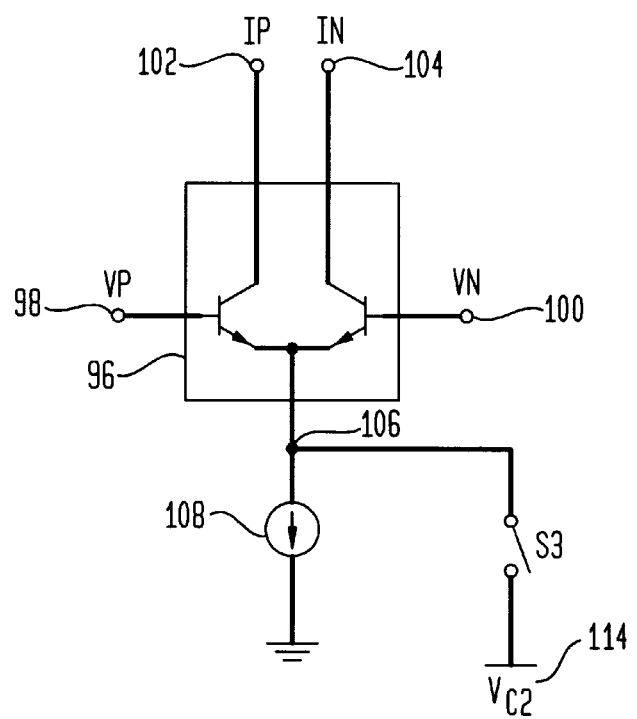
FIG. 8 is another block diagram of another embodiment of a transconductance circuit according to the invention.

Referring finally to FIG. 8, another simplified block diagram of an embodiment of the invention is shown. The embodiment shown in FIG. 8 could correspond, for example, to transconductance circuit 58a (shown in FIG. 6) in the following manner: (1) input nodes 98 and 100 (FIG. 8) could correspond to respective input nodes 42 and 53 (FIG. 6); (2) output nodes 102 and 104 (FIG. 8) could correspond to respective output nodes 49 and 51 (FIG. 6); (3) differential pair of input transistors 96 (FIG. 8) could include transistors Q14 and Q20 (FIG. 6); (4) common emitter node 106 (FIG. 8) could correspond to common emitter node 52 (FIG. 6); (5) current source 108 (FIG. 8) could correspond to current source transistor Q19 (FIG. 6); (6) switch S3 (FIG. 8) could correspond to switch transistor Q28 (FIG. 6); and (7) constant voltage node 114 having voltage VC2 thereon (FIG. 8) could correspond to common node 78 (FIG. 6).

Driven by current source 108, differential pair of input transistors 96 (having current nodes coupled at a common node 106) is adapted to receive an input voltage across respective control nodes 98 and 100 and to provide a differential output current between respective current nodes 102 and 104 that is proportional to the input voltage. Switch S3 is coupled between common node 106 and constant voltage node 114.

The closing of switch S3 in this embodiment performs a dual function: (1) current from current source 108 is steered away from differential pair of input transistors 96 so as to disable the transconductance circuit; and (2) a low impedance path is established between common node 106 and constant voltage node 114 (so as to provide T-switch-like isolation between inputs 98 and 100). This improved isolation between the inverting and non-inverting inputs of differential pair of input transistors 96 can provide a significant advantage when the inverting input thereof is fed from an output of a multiplexer circuit, as is illustrated in FIGS. 4 and 5.

It should be understood that while the switched-transconductance circuits shown in the examples described herein employ bipolar junction transistors (BJTs), the circuit could be implemented equivalently using metal oxide semiconductor (MOS) or any other transistor type without departing from the intended scope of the invention. In addition, while the switched-transconductance circuit described herein is implemented with a differential pair of input transistors driven by a controllable current source, the scope of the invention is not so limited, as any "switchable" transconductance circuit could be used equivalently. Further, while the switched-transconductance circuit has been described in the context of a two-stage commutating op-amplifier with a variable-gain feedback attenuation circuit, this embodiment is exemplary in nature and the scope of the invention should not be so limited.

It should also be understood that while the switches described herein are implemented using transistors controlled at their gates, any circuit that is capable of selectively providing a low-impedance signal path between two points could equivalently be used. Further, it should be understood that the number of similar transconductance circuits that could be added in parallel to circuits 58a and 58b (to provide n:1 multiplexing) is virtually unlimited.

Having thus described illustrative embodiments of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit, comprising:
  a first transconductance stage including:
    a transconductance element that receives a first control signal to enable the transconductance element and a first input voltage and, when enabled, provides a first output current to at least one output node of the transconductance element, the first output current having an amplitude that is proportional to an amplitude of the first input voltage;
    at least one first switch coupled between the at least one output node of the transconductance element and an output node of the first transconductance stage such that activation of the at least one first switch causes the at least one output node of the transconductance element to be coupled to the output node of the first transconductance stage; and
    at least one second switch coupled between the at least one output node of the transconductance element and a constant voltage node, the at least one second switch being activated such that, regardless of a state of the at least one first switch, the at least one output node of the transconductance element is coupled to the constant voltage node;
  a second transconductance stage that receives a second input voltage and provides a second output current having an amplitude that is proportional to an amplitude of the second input voltage; and
  at least one additional circuit stage that receives the first and second output currents and, responsive thereto, provides an output signal at a signal output node that is proportional to a combination of the first and second output currents.

2. The circuit as claimed in claim 1, wherein the at least one second switch is activated when the transconductance element is not enabled.

3. The circuit as claimed in claim 2, wherein the at least one first switch is activated when the transconductance element is enabled.

4. The circuit as claimed in claim 1, wherein the transconductance element includes a differential pair of input transistors, at least one of the differential pair of input transistors receiving the first input voltage and providing the first output current, respectively, on a control node and a current node thereof.

5. The circuit as claimed in claim 4, wherein the at least one first switch includes a cascode transistor coupled to the current node of the at least one of the differential pair of input transistors, the cascode transistor being coupled to the transconductance element such that the first output current is permitted to pass therethrough only when the transconductance element is enabled.

6. The circuit as claimed in claim 4, further comprising a third switch coupled between a common node of the differential pair of input transistors and a constant voltage node such that activation of the third switch causes the common node to be coupled to the constant voltage node.

7. The circuit as claimed in claim 1, wherein:
the at least one output node of the transconductance element includes a pair of output nodes;
the transconductance element is adapted to receive the first input voltage across a pair of input nodes and to provide the first output current, as a differential current, between the pair of output nodes; and
the transconductance element produces the differential current such that an amplitude of the differential current is approximately zero when an amplitude of the first input voltage is approximately zero.

8. The circuit as claimed in claim 1, further comprising a variable gain attenuator coupled between the signal output node and an input of each of the first and second transconductance stages, the variable gain attenuator receiving at least one second control signal and, responsive thereto, adjusting feedback attenuation of the circuit.

9. The circuit as claimed in claim 1, wherein the at least one first switch is coupled to the transconductance stage such that, when the transconductance element is enabled, the at least one first switch is activated to allow the first output current to flow between the at least one output node of the transconductance element and the output node of the first transconductance stage.

10. The circuit as claimed in claim 1, wherein:
the at least one first switch is connected to each of the at least one output node of the transconductance element and the output node of the first transconductance stage such that activation of the at least one first switch causes the at least one output node of the transconductance element to be connected to the output node of the first transconductance stage via the at least one first switch; and
the at least one second switch is connected to each of the at least one output node of the transconductance element and the constant voltage node, the at least one second switch being activated such that, regardless of the state of the at least one first switch, the at least one output node of the transconductance element is connected to the constant voltage node via the at least one second switch.

11. The circuit as claimed in claim 1, wherein the at least one first switch is activated when the transconductance element is enabled.

12. The circuit as claimed in claim 1, wherein the at least one first switch is activated when the at least one second switch is not activated, and the at least one second switch is activated when the at least one first switch is not activated.

13. The circuit as claimed in claim 3, wherein the at least one first switch is activated when the at least one second switch is not activated, and the at least one second switch is activated when the at least one first switch is not activated.

14. The circuit as claimed in claim 6, wherein the third switch is activated when the transconductance element is not enabled.

15. The circuit of claim 1, wherein the at least one additional circuit stage is configured to provide an output voltage at the signal output node that is proportional to the combination of the first and second output currents.

16. The circuit as claimed in claim 10, wherein:
the at least one first switch is directly connected to each of the at least one output node of the transconductance element and the output node of the first transconductance stage such that activation of the at least one first switch causes the at least one output node of the transconductance element to be connected to the output node of the first transconductance stage via the at least one first switch; and
the at least one second switch is directly connected to each of the at least one output node of the transconductance element and the constant voltage node, the at least one second switch being activated such that, regardless of the state of the at least one first switch, the at least one output node of the transconductance element is connected to the constant voltage node via the at least one second switch.

* * * * *